(12) United States Patent
Duss et al.

(10) Patent No.: US 10,939,567 B2
(45) Date of Patent: Mar. 2, 2021

(54) ELECTRONIC MODULE USING BOARD LACQUER TO REINFORCE THE CIRCUIT BOARD TO THE UNIT HOUSING

(71) Applicant: Bayerische Motoren Werke Aktiengesellschaft, Munich (DE)

(72) Inventors: Mike Duss, Karlsruhe (DE); Martin Kaltenbrunner, Taufkirchen (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 16/573,274

(22) Filed: Sep. 17, 2019

(65) Prior Publication Data

US 2020/0015372 A1    Jan. 9, 2020

Related U.S. Application Data

(63) Continuation of application No. PCT/EP2018/060452, filed on Apr. 24, 2018.

(30) Foreign Application Priority Data

May 4, 2017  (DE) .................. DE10 2017 207 491

(51) Int. Cl.
  *H05K 5/00* (2006.01)
  *H05K 5/06* (2006.01)
(52) U.S. Cl.
  CPC ......... *H05K 5/0069* (2013.01); *H05K 5/0043* (2013.01); *H05K 5/06* (2013.01)
(58) Field of Classification Search
  CPC ...... H05K 5/0043; H05K 5/06; H05K 5/0069; H05K 5/0056; H01K 12/7074

USPC .......................................................... 439/74
See application file for complete search history.

(56) References Cited

U.S. PATENT DOCUMENTS

| 4,766,268 | A   | * | 8/1988 | Uggowitzer | H05K 3/3452 |
| | | | | | 174/256 |
| 6,084,776 | A   |   | 7/2000 | Cuntz et al. | |
| 6,549,426 | B1  | * | 4/2003 | Lawlyes | H05K 9/0015 |
| | | | | | 361/816 |
| 7,576,427 | B2  | * | 8/2009 | Potter | B81C 1/00269 |
| | | | | | 257/704 |
| 7,939,768 | B2  | * | 5/2011 | Hara | H03H 9/0514 |
| | | | | | 174/564 |
| 8,941,017 | B2  | * | 1/2015 | Nagano | H03H 9/1021 |
| | | | | | 174/50.5 |

(Continued)

FOREIGN PATENT DOCUMENTS

| CN | 1902764 A   | 1/2007 |
| DE | 1 231 772 A | 1/1967 |

(Continued)

OTHER PUBLICATIONS

International Search Report (PCT/ISA/210) issued in PCT Application No. PCT/EP2018/060452 dated Aug. 22, 2018 with English translation (seven (7) pages).

(Continued)

*Primary Examiner* — Peter G Leigh
(74) *Attorney, Agent, or Firm* — Crowell & Moring LLP

(57) ABSTRACT

An electronic module includes a carrier element and a circuit board. The circuit board is attached in and/or to the carrier element via at least one connection site. The at least one connection site is formed by means of a hardenable medium.

13 Claims, 1 Drawing Sheet

(56) References Cited

U.S. PATENT DOCUMENTS

| | | | |
|---|---|---|---|
| 9,093,776 B2* | 7/2015 | Yamanaka | H05K 5/0069 |
| 9,688,228 B2* | 6/2017 | Azuma | B60R 21/01 |
| 2003/0147204 A1 | 8/2003 | Koike et al. | |
| 2004/0094320 A1* | 5/2004 | Goto | H01L 23/10 174/50.51 |
| 2005/0279521 A1* | 12/2005 | Satullo | H05K 9/0015 174/50.5 |
| 2006/0151203 A1* | 7/2006 | Krueger | H03H 9/1071 174/260 |
| 2007/0141263 A1* | 6/2007 | Schaefer | B05C 1/025 427/355 |
| 2007/0274636 A1 | 11/2007 | Blumel | |
| 2010/0271791 A1 | 10/2010 | Loibl et al. | |
| 2015/0031221 A1* | 1/2015 | Sloey | H01R 12/00 439/66 |
| 2018/0177058 A1 | 6/2018 | Liskow | |

FOREIGN PATENT DOCUMENTS

| | | | |
|---|---|---|---|
| DE | 195 28 632 A1 | 2/1997 | |
| DE | 103 04 886 A1 | 10/2003 | |
| DE | 10 2007 035 060 A1 | 1/2009 | |
| DE | 10 2007 042 593 A1 | 3/2009 | |
| DE | 10 2011 088 279 A1 | 6/2012 | |
| DE | 102011088279 A1 * | 6/2012 | ........... H05K 5/0056 |
| DE | 10 2011 121 823 A1 | 7/2013 | |
| DE | 10 2013 215 227 A1 | 2/2015 | |
| DE | 10 2015 214 311 A1 | 2/2017 | |
| DE | 10 2015 217 802 A1 | 3/2017 | |
| EP | 3247013 A4 * | 8/2018 | ......... B60R 16/0239 |
| WO | WO 2009/013694 A2 | 1/2009 | |
| WO | WO 2009/033890 A1 | 3/2009 | |
| WO | WO 2012/089971 A1 | 7/2012 | |
| WO | WO 2015/185307 A1 | 12/2015 | |

OTHER PUBLICATIONS

German-language Written Opinion (PCT/ISA/237) issued in PCT Application No. PCT/EP2018/060452 dated Aug. 22, 2018 (six (6) pages).

German-language Search Report issued in counterpart German Application No. 10 2017 207 491.4 dated Mar. 8, 2018 with partial English translation (12 pages).

English translation of an Chinese Office Action issued in Chinese Application No. 201880018997.X dated Jun. 15, 2020 (nine (9) pages).

* cited by examiner

ELECTRONIC MODULE USING BOARD LACQUER TO REINFORCE THE CIRCUIT BOARD TO THE UNIT HOUSING

CROSS REFERENCE TO RELATED APPLICATIONS

This application is a continuation of PCT International Application No. PCT/EP2018/060452, filed Apr. 24, 2018, which claims priority under 35 U.S.C. § 119 from German Patent Application No. 10 2017 207 491.4, filed May 4, 2017, the entire disclosures of which are herein expressly incorporated by reference.

BACKGROUND AND SUMMARY OF THE INVENTION

Embodiments of the present invention relate to an electronic module, a control unit, a method for attaching a circuit board and use of circuit board lacquer.

Electronic modules of the type discussed here are used inter alia to ascertain, process and/or output signals and data. By way of example, electronic modules are used in the form of control units in motor vehicles in order to coordinate and provide the most varied of vehicle functions. Electronic modules/control units of this type comprise a plurality of components, such as for example electrical resistors, coils, capacitors, integrated circuits (ICs), various types of sensors, actuators and plug connectors etc., which are mechanically held on a substrate and in addition are electrically connected to one another via said substrate. The substrate is generally a circuit board (also referred to as a PCB, printed circuit board). Conductor tracks may be provided on or in the circuit board so as to connect the components. Alternatively, the components may be arranged by way of example on lead frames and connected with the aid of said lead frames. It is problematic in this connection that in the case of circuit boards of this type the components are extremely complicated and malfunctions or damage may rapidly lead to the failure of the entire vehicle. In particular, it is particularly absolutely necessary to avoid mechanical loads which result by way of example in the circuit board warping since the admissible stresses in the circuit board are extremely low. The admissible limit values are often exceeded even during the procedure of installing the circuit board in the corresponding housing of the control unit, by way of example as a result of stressing or warping the circuit board. Even if by way of example plug connectors are attached to the housing of the control unit, the pressure that is applied for this purpose may cause the circuit board to warp and as a result also to become damaged.

It is therefore an object of the present invention to propose an electronic module, a control unit, a method for attaching a circuit board and also use of a circuit board lacquer, which eliminate the aforementioned disadvantages and which in so doing in particular represent a simple and cost efficient solution.

This object is achieved by means of the inventive electronic module, the inventive control unit, and the inventive method presented herein. Further advantages and features are disclosed in the subordinate claims and also in the description and the attached figures.

In accordance with an embodiment of the invention, an electronic module comprises a carrier element and a circuit board, wherein the circuit board is attached in and/or to the carrier element via at least one connection site, and wherein the at least one connection site is formed by means of a hardenable medium. It is preferred that a bonded connection is realized by means of the at least one connection site. In particular, the circuit board is attached in and/or to the carrier element in a stress-free manner. It is preferred that a plurality of connection sites are provided. The medium is expediently a medium that comprises two states, namely a fluid state and a solid state, in other words a state in which the medium may harden. It is consequently expediently possible by means of arranging the carrier element and the circuit board with respect to one another to realize a particular dimension or rather in particular for example a height of the connection sites. The medium is advantageously applied in the fluid state and may therefore adapt to suit the shape of the carrier element or rather of the circuit board. In other words, it is not the connection sites that dictate an orientation or rather positioning of the two aforementioned components but rather the shape and position of the circuit board or rather of the carrier element, in particular the specific shape and position of the connection site(s) with respect to one another. As a consequence, it is rendered possible that the carrier element supports the circuit board in an ideal manner, in particular without changing the shape of the circuit board or applying loads during the attachment procedure. The circuit board is therefore not stressed, as is by way of example the case in the prior art if a circuit board is attached to a carrier element via screw connections or firmly seated positive locking and non-positive locking connections. However, it is primarily not excluded that the carrier element and the circuit board are also attached to one another via positive locking and/or non-positive locking connections, in particular also in the form of screw connections. Said screw connections are however advantageously configured and positioned in such a manner that the circuit board is not stressed. In accordance with one embodiment, the circuit board is held for example only at one or two sites via a screw connection. The present circuit board, also referred to as a PCB (printed circuit board), comprises in accordance with various embodiments at least one or multiple electronic components, such as by way of example processors, electrical resistors, coils, capacitors, integrated circuits (ICs), various types of sensors, actuators and plug connectors etc., wherein the electronic components are preferably mechanically held on the circuit board and electrically connected to one another via said circuit board, For this purpose, conductor tracks are provided on and/or in or on the circuit board. Generally, circuit boards of this type are never completely planar or rather flat, on the contrary they comprise for example over a length of approx. 20 cm a height variance of at least a few micrometers. This in itself small deviation with regard to the flatness may even lead to the admissible bending stresses being exceeded during the procedure of fixedly screwing the circuit board. This creates the risk of friction corrosion on the plug connector contacts, the risk of the conductor tracks breaking and of the processors malfunctioning etc. However, by virtue of the fact that the connection sites are formed from a hardenable medium, stresses are not produced as the circuit board is being attached to the carrier element. Moreover, the circuit board is supported in an ideal manner.

In accordance with an embodiment, the connection site(s) fills/fill voids, gaps and/or undercuts between the carrier element and the circuit board or rather closes/close said voids, gaps and/or undercuts. In particular, the connection sites are therefore tailored to suit the circuit board with regard to the shape and/or the orientation, in such a manner that it is possible to attach the circuit board in a stress-free manner.

In accordance with an embodiment, the hardenable medium is by way of example an adhesive, preferably an adhesive that in a first state is fluid, in particular runny. An adhesive of this type may be applied to various sites on the circuit board and/or on the carrier element. In a next step, the carrier element and the circuit board are then arranged on one another and the connection sites are advantageously formed at the sites where the carrier element and the circuit board are close to one another or are possibly also in contact with one another. After the connection sites have hardened, the carrier element and the circuit board are attached to one another, wherein this attachment procedure is performed in particular in a stress-free manner.

In accordance with an embodiment, the hardenable medium is a circuit board lacquer. Conventionally, the circuit board lacquer is primarily used to protect the electronic parts/electronic components on the circuit board against moisture and water penetration. In the present case, the circuit board lacquer that is in any case required is now ideally used in addition to connect or rather to attach and also to reinforce the circuit board. This is rendered possible in particular by virtue of the fact that the circuit board lacquer forms the connection sites. The entire surface of the circuit board is expediently completely covered or wetted with the circuit board lacquer, wherein this is performed by means of immersing the circuit board in the initially fluid circuit board lacquer and subsequently expediently allowing said lacquer to drip off. The choice of circuit board lacquer is not critical in the present case. Said circuit board lacquer may be, depending upon the requirement, a circuit board lacquer that contains silicone or does not contain silicone. The circuit board lacquer may also be applied by means of a spraying procedure. It is thus fundamentally possible to apply the circuit board lacquer first and then to position the carrier element. The carrier element may also be wetted with circuit board lacquer (or with an adhesive). It is preferred that the circuit board is arranged on the carrier element and subsequently said circuit board and carrier element are jointly immersed to a specific immersion depth which ensures that the electronic components or the circuit board as such are sufficiently wetted with the circuit board lacquer. In so doing, advantageously regions of the carrier element are also wetted with the circuit board lacquer, with the result that connection sites are formed so to say "automatically" after the medium/circuit board lacquer has hardened. In so doing, the medium/circuit board lacquer is advantageously applied thin, by way of example with a layer thickness of a maximum up to 1 mm preferably less.

In other words, it is preferred that the connection sites are produced or rather formed by virtue of immersing at least regions of the circuit board and the carrier element in the hardenable medium.

Expediently, the circuit board is arranged or may be arranged in and/or on the carrier element in a positive locking manner, in particular may be plugged on or in said circuit board. The arrangement may in this case also be formed in a relative "loose" manner since the actual attachment is realized via the hardenable medium. The loose arrangement provides the advantage that (bending) stresses are not induced.

The carrier element expediently comprises at least one hook element that is configured so as to be connected to the circuit board in a positive locking and/or non-positive locking manner, wherein at least one connection site is provided in the region of the positive locking and/or non-positive locking connection. Hook or snap-in connections of this type are fundamentally known from the prior art. One problem of such connections resides in the fact that this type of connection does not guarantee a reliable non-positive locking and/or positive locking arrangement. A circuit board that is "attached" in this manner may easily warp as a plug connector is attached to the corresponding control unit. This creates for example the risk of friction corrosion on the plug connector contacts, the conductor tracks breaking and the processors malfunctioning etc. However, in addition the connection sites that are formed from the hardenable medium are now advantageously provided in the region of these hook elements or rather hook or snap-in connections, said connection sites being configured so as to fix the aforementioned positive locking and/or non-positive connections. In other words, in particular a bonded connection is provided in addition which ensures the positive locking and non-positive locking arrangement even over the serviceable life of the product. By virtue of the fact that the hardenable medium is fluid in the first state, it may flow into any voids, gaps, undercuts etc. of the hook and snap-in connecting elements and fix said elements after the medium has hardened.

In accordance with an embodiment, the carrier element and/or the circuit board also comprise additional elements that extend by way of example in a transverse or oblique manner toward a circuit board plane and form additional undercuts, voids or gaps into which the hardenable medium may flow in order to provide so to say additional "bonding areas".

In accordance with an embodiment, the circuit board comprises at least one electronic component, in particular a pin block, wherein at least one connection site is configured on the at least one electronic component, in particular on the pin block. The carrier element expediently comprises a corresponding collar connection that is configured for arranging in a positive locking manner on the pin block. The pin block is for example soldered on the circuit board and comprises a plurality of pins that extend in a transverse manner toward the circuit board plane. It is possible by way of example to arrange/connect a suitable plug connector to these pins. During the procedure of arranging the plug connector, a pressure force is exerted on the circuit board which may lead to the circuit board warping and as a result to bending stress values or surface stresses being exceeded. However, at least one connection site is now advantageously configured in the region of the pin block, said connection site connecting the pin block to the carrier element or rather to a collar connection of the carrier element in a bonded manner. In this respect, the rigidity or rather strength of the carrier element may be ideally transmitted to the circuit board. As a consequence, the circuit board does not warp during the procedure of arranging the aforementioned plug connector, the reason being that said circuit board is ideally supported by means of the carrier element.

The outer dimensions of the carrier element, projected onto the circuit board plane, expediently correspond essentially to the outer dimensions of the circuit board. The carrier element is expediently configured or rather embodied in such a manner as to protrude from or encompass the circuit board, in other words the circuit board is advantageously embedded in the carrier element. Expediently, it is ensured that the carrier element supports the circuit board to the best possible extent. In so doing, the connection sites are arranged (distributed) in such a manner that the strength/rigidity of the carrier element may be transmitted in the best possible manner to the circuit board or rather that said circuit board may be supported on the carrier element in the best possible manner.

The connection sites are expediently arranged distributed on the carrier element, in particular distributed in an essentially regular and uniform manner. This means that connection sites are provided both in the edge regions and also in the middle region of the carrier element, the reason being that as a consequence it is possible to guarantee that the circuit board is supported over its entire surface. In accordance with one embodiment, a plurality of connection sites are configured in the form of a matrix-shaped grid. However, the connection sites are often more likely to be distributed in an irregular manner since their number, orientation and position are dictated in particular by the geometric shape of the circuit board and carrier.

In accordance with an embodiment, the carrier element is a housing or a housing part of the electronic module, in particular an outer housing. In accordance with an embodiment, the electronic module is a master or central control unit of a motor vehicle, in particular of a passenger car. Control units of this type are arranged by way of example in the region of the internal compartment of the vehicles. The housing or housing parts are manufactured for this purpose from a suitable synthetic material. In particular, the carrier element is for example a housing shell of a two-part housing, by way of example an upper or a lower housing shell.

In accordance with an embodiment, the housing or the housing part comprises at least one connection sleeve or rather forms said connection sleeve or configures said connection sleeve. The connection socket is used for arranging a suitable plug connector that is provided so as to produce an electrical connection, by way of example with the aforementioned pin block. The aforementioned collar connection expediently corresponds with the recently mentioned connection socket to such an extent that the housing forms on its outer face the connection socket and on its corresponding inner face forms the aforementioned collar connection that is configured in particular for arranging in a positive locking manner on the pin block. Expediently, the carrier element or rather the housing may comprise a plurality of connection sockets of this type, which may also differ with respect to size. The same applies for the aforementioned pin blocks etc.

In accordance with an embodiment, the carrier element or rather the housing or the housing part comprises a reinforcing structure, wherein the reinforcing structure comprises braces, struts and/or honey-comb structures that extend essentially perpendicular to the circuit board plane. It is preferred that reinforcing structures of this type are provided on the inner face of the carrier element, facing the circuit board. Typical wall thicknesses of the carrier element or rather of the housing or of the housing parts lie in a range of approx. 1-3 mm. The housing parts are preferably connected in a positive locking and/or non-positive locking manner, wherein in so doing snap-in and hook elements may be used. Where appropriate, the housing parts are also (in addition) screwed to one another. In addition, the connection sites that are formed from the hardenable material may also be provided so as to attach the housing parts to one another.

The embodiments of the invention also relate to a control unit, in particular a master control unit of a motor vehicle, comprising a housing and a circuit board that is arranged in said housing, wherein the circuit board is attached via at least one connection site in and/or to the housing, and wherein the at least one connection site is formed by means of a hardenable medium. In particular, the control unit is a central or rather master control unit of a motor vehicle, wherein the circuit board is arranged in the, preferably two-part, housing of said motor vehicle.

The embodiments of the invention further relates to a method for attaching a circuit board to a carrier element, in particular to a housing or a housing part, the method comprising the acts of:
providing a circuit board and a carrier element;
attaching the circuit board to the carrier element by means of a plurality of connection sites and forming the connection sites by means of applying a hardenable medium.

The method may further comprises the act of:
arranging, in particular arranging in a stress-free manner, the circuit board in and/or on the carrier element; and
immersing the circuit board in the hardenable medium.

In this respect, the hardenable medium is applied by means of immersing the circuit board and at least in regions also the carrier element in the hardenable medium, wherein the hardenable medium is preferably a circuit board lacquer. Alternatively, the circuit board and/or the carrier element may also be sprayed with the medium/circuit board lacquer, wherein the coating is fundamentally then also applied if the circuit board and the carrier element are not yet arranged against one another. Since the circuit board lacquer is in any case generally applied by means of immersing the circuit board, it is particularly advantageous if within the scope of this process step the connection sites are also simultaneously formed.

The circuit board is expediently also moved, by way of example pivoted, after the application of the medium/circuit board lacquer, with the result that the (still) runny fluid lacquer (or rather in general the medium) may flow into possible intermediate spaces, voids etc. between the circuit board and the carrier element in order to form connection sites therein after the medium has hardened.

The embodiments of the invention also relate to use of circuit board lacquer for reinforcing or rather attaching a circuit board to a carrier element, in particular to a housing of a control unit.

The features and advantages mentioned in connection with the electronic module apply similarly and correspondingly and also conversely and mutually for the control unit in accordance with the invention, the method in accordance with the invention and use in accordance with the embodiments of the invention.

Other objects, advantages and novel features of the embodiments of the present invention will become apparent from the following detailed description of one or more preferred embodiments when considered in conjunction with the accompanying drawings, in which:

DETAILED DESCRIPTION OF THE DRAWINGS

Figure 1:
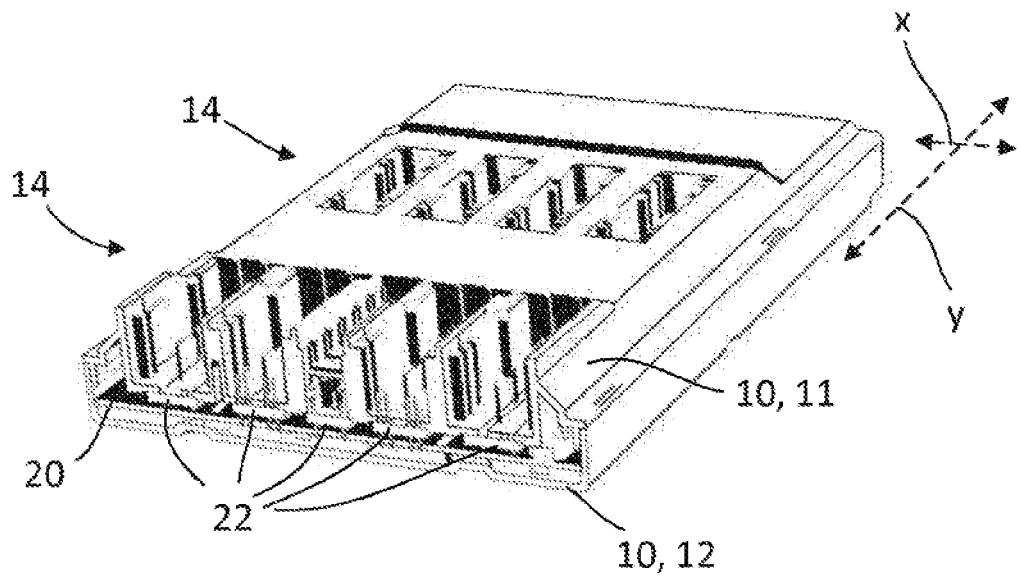
FIG. 1 is a perspective view of a control unit in a sectional view.

FIG. 1 illustrates in a perspective view an electronic module that comprises two carrier elements 10. The illustrated electronic module is by way of example a master or rather central control unit of a motor vehicle, by way of example of a passenger car, wherein the two carrier elements 10 form a housing of the control unit. The housing comprises in particular a housing upper part 11 and a housing lower part 12, wherein a circuit board 20 is arranged between the two parts. The housing upper part 11 comprises a plurality of connection sockets 14 that are used for receiving corresponding plug connectors (not illustrated). A plurality of pin blocks 22 in the interior of the control unit become apparent by virtue of the sectional view, said pin blocks being soldered to the circuit board 20. The pins of the pin blocks 22 protrude into the connection sockets 14. The dashed arrows x and y indicate directions which are used for the better understanding of FIGS. 2 and 3.

Figure 2:
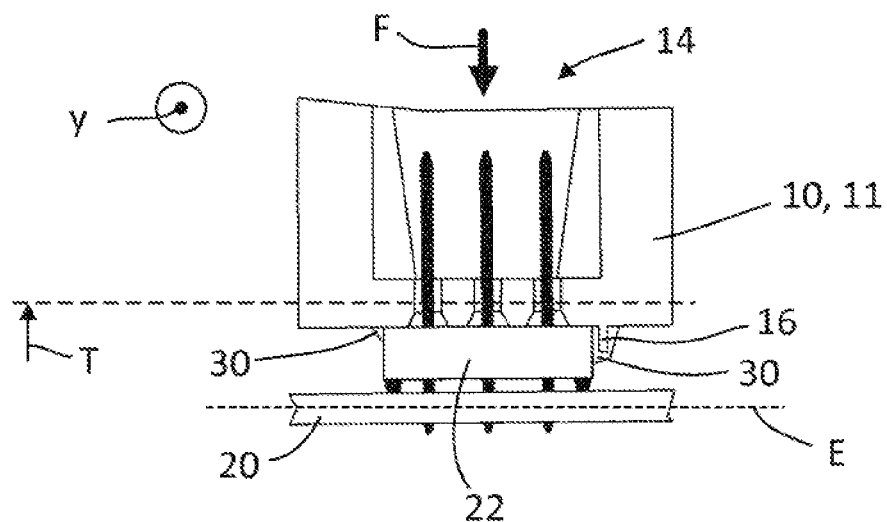
FIG. 2 is a detailed view of a connection region of the control unit shown in FIG. 1.

FIG. 2 illustrates in a section along the x-direction a view of the circuit board 20 which defines a circuit board plane E. A pin block 22 is arranged, by way of example soldered, on the circuit board 20. The housing upper part 11 or rather a carrier element 10 is arranged or rather placed over said pin block. In particular, the region visible here may be referred to as a collar connection that renders it possible to connect the housing upper part 11 to the circuit board 20 by means of the pin blocks 22. The reference numerals 30 indicate connection sites which are formed from a hardenable medium. The aforementioned medium is preferably for example a circuit board lacquer. An additional element 16 extends away from the collar connection or rather from the housing upper part 11 forms together with the pin block 22 an additional gap or rather an additional undercut into which the hardenable medium, in particular the circuit board lacquer, may flow. The reference numeral T indicates a possible immersion depth. This means that by way of example the housing upper part 11 together with the circuit board 20 is immersed in a container of circuit board lacquer up to this depth in order on the one hand to apply the circuit board lacquer to the circuit board 20 and on the other hand to simultaneously, quasi automatically, form the connection sites 30. The connection sites 30 produce a bonded connection between the carrier element 10, in the form of the housing upper part 11, and the circuit board 20, as a result of which it is possible for a strength or rather rigidity of the housing upper part 11 to be transmitted to the circuit board 20. If a plug connector is plugged into the connection socket 14, a force is exerted along a force direction F, as indicated in FIG. 2. This (pressure) force could cause the circuit board 20 to warp. However, the connection sites 30 ensure that the rigidity of the housing upper part 11 is transmitted to the circuit board 20 in such a manner that warping of this type does not occur.

Figure 3:
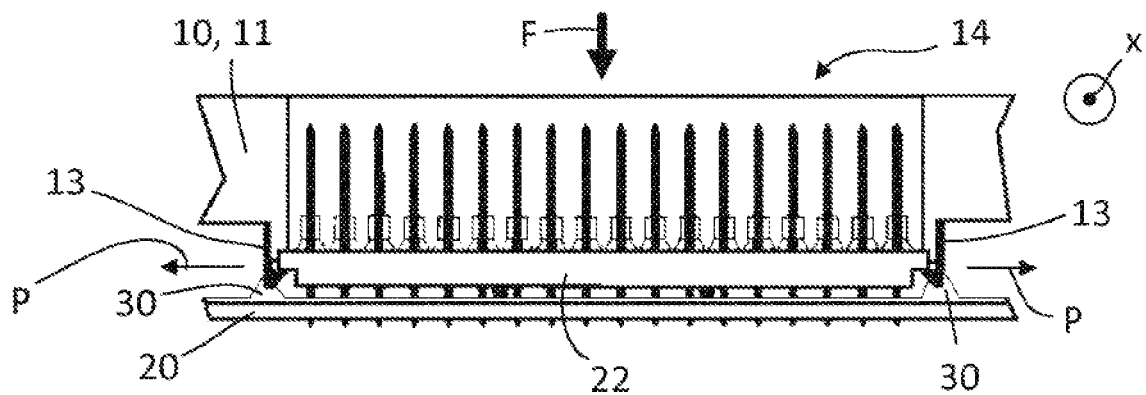
FIG. 3 is a further detailed view of a connection region of the control unit shown in FIG. 1.

FIG. 3 illustrates with regard to FIG. 1 a sectional view along the y-direction. A pin block 22 that is arranged on the circuit board 20 is also apparent here. The housing upper part 11 is arranged via corresponding hook elements 13. Since a plug connector is arranged in the connection socket 14, there is the danger that the pressure force that is exerted along the force direction F may cause the hook elements 13 to deflect sideward and outward, wherein this deflection is indicated by the arrows P. However, the connection sites 30 expediently now fix or rather hold said hook elements with the result that a reliable non-positive locking and positive locking connection is ensured.

The connection sites 30 are only illustrated sketchily in the figures. The circuit board 20 is preferably completely immersed in the circuit board lacquer, as a result of which voids, undercuts etc. between the circuit board 20 and the respective carrier element 10 are closed or rather filled and connection sites 30 may be formed. In this respect, for example with regard to FIG. 2, the entire circuit board 20, the pin block 22 and also the housing lower part 11 is wetted with circuit board lacquer up to the immersion depth T. The circuit board 20 may be arranged in the corresponding carrier element 10 via simply inserting or rather placing the circuit board 20 in/on said carrier element. However, as is particularly apparent in FIG. 3, it is also possible to provide corresponding snap-in or hook elements or rather general positive locking and/or non-positive locking connecting elements in order to render it possible at least to prefix the circuit board 20 with regard to the respective carrier element 10. This prefixing arrangement is configured in particular in a stress-free manner and does not cause the circuit board 20 to warp.

LIST OF REFERENCE NUMERALS

10 Carrier element, housing, housing part, housing shell
11 Housing upper part
12 Housing lower part
13 Hook element
14 Connection socket
16 Additional element
20 Circuit board
22 Electronic component, pin block
30 Connection site
E Circuit board plane
T Immersion depth
F Force direction
P Arrows
x, y Directions The foregoing disclosure has been set forth merely to illustrate the embodiments of the invention and is not intended to be limiting. Since modifications of the disclosed embodiments incorporating the spirit and substance of the invention may occur to persons skilled in the art, the embodiments of the invention should be construed to include everything within the scope of the appended claims and equivalents thereof.

What is claimed is:
1. An electronic module comprising:
a carrier element; and
a circuit board, wherein
the circuit board is attached in and/or to the carrier element via at least one connection site,
the at least one connection site is formed by means of a hardenable medium, and
the hardenable medium is circuit board lacquer.
2. The electronic module according to claim 1, further comprising:
a plurality of connection sites, wherein
the plurality of connection sites preferably fill or close voids, gaps, or undercuts between the carrier element and the circuit board.
3. The electronic module according to claim 1, wherein the plurality of connection sites are formed by means of immersing at least in regions the circuit board and the carrier element in the hardenable medium.
4. The electronic module according to claim 3, wherein the circuit board is arranged or may be arranged in and/or on the carrier element in a positive locking manner, by being plugged on or in said carrier element.
5. The electronic module according to claim 4, wherein the carrier element comprises at least one hook element that is configured so as to be connected to the circuit board in a positive locking and/or non-positive locking manner, and at least one connection site is provided in the region of the positive locking and/or non-positive locking connection.

6. The electronic module according to claim 5, wherein the circuit board comprises at least one electronic component, and
at least one connection site is produced on the at least one electronic component.

7. The electronic module according to claim 6, wherein the outer dimensions of the carrier element correspond essentially to the outer dimensions of the circuit board.

8. The electronic module according to claim 7, wherein the carrier element is an outer housing or an outer housing part of the electronic module.

9. The electronic module according to claim 8, wherein the housing or the housing part forms, or produces at least one connection socket.

10. The electronic module according to claim 9, wherein the carrier element comprises a reinforcing structure, and
the reinforcing structure comprises braces, struts, or honey-comb structures that extend perpendicular to a circuit board plane.

11. A master control unit of a motor vehicle, comprising:
a housing; and
a circuit board that is arranged in the housing, wherein
the circuit board is attached in and/or to the housing via at least one connection site,
the at least one connection site is formed by means of a hardenable medium, and
the hardenable medium is circuit board lacquer.

12. A method for attaching a circuit board to a housing or a housing part, comprising the acts of:
providing a circuit board and a carrier element;
attaching the circuit board to the carrier element by means of a plurality of connection sites;
producing the connection sites by means of applying a hardenable medium, and
using circuit board lacquer to reinforce or attach the circuit board to the carrier element.

13. The method according to claim 12, further comprising the acts of:
arranging in a stress-free manner, the circuit board in and/or on the carrier element;
immersing the circuit board in the hardenable medium.

* * * * *